(12) United States Patent
Yu et al.

(10) Patent No.: US 10,366,906 B2
(45) Date of Patent: Jul. 30, 2019

(54) ELECTRONIC PACKAGE AND ITS PACKAGE SUBSTRATE

(71) Applicant: PHOENIX PIONEER TECHNOLOGY CO., LTD., Hsinchu County (TW)

(72) Inventors: Chun-Hsien Yu, Hsinchu County (TW); Hsien-Ming Tsai, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 15/823,831

(22) Filed: Nov. 28, 2017

(65) Prior Publication Data

US 2019/0074196 A1    Mar. 7, 2019

(30) Foreign Application Priority Data

Sep. 5, 2017    (TW) .............................. 106213140 U

(51) Int. Cl.
*H01L 23/48*    (2006.01)
*H01L 21/56*    (2006.01)
*H01L 21/48*    (2006.01)
*H01L 23/31*    (2006.01)
*H05K 1/02*    (2006.01)

(52) U.S. Cl.
CPC .......... *H01L 21/56* (2013.01); *H01L 21/4825* (2013.01); *H01L 23/3121* (2013.01); *H05K 1/0209* (2013.01); *H01L 2224/48091* (2013.01); *H01L 2224/73265* (2013.01); *H01L 2924/01029* (2013.01); *H01L 2924/181* (2013.01); *H05K 2201/066* (2013.01)

(58) Field of Classification Search
CPC ....... H01L 23/3121; H01L 2224/48091; H01L 21/56; H05K 2201/066
USPC ......................................... 257/706, 713, 774
See application file for complete search history.

(56) References Cited

U.S. PATENT DOCUMENTS

| | | | | |
|---|---|---|---|---|
| 5,111,278 A | * | 5/1992 | Eichelberger | H01L 23/473 257/698 |
| 5,900,676 A | * | 5/1999 | Kweon | H01L 21/4832 257/296 |
| 5,976,912 A | * | 11/1999 | Fukutomi | H01L 21/4803 257/E21.502 |
| 6,001,671 A | * | 12/1999 | Fjelstad | H01L 21/4832 257/E21.502 |
| 6,025,650 A | * | 2/2000 | Tsuji | H01L 21/565 257/668 |
| 6,031,291 A | * | 2/2000 | Sato | H01L 21/0276 257/382 |

(Continued)

*Primary Examiner* — Nitin Parekh
(74) *Attorney, Agent, or Firm* — Amin, Turocy & Watson LLP

(57) ABSTRACT

The present disclosure provides an electronic package, including a package substrate and an electronic component formed on the package substrate. The substrate includes an insulating portion, a wiring portion embedded in the insulating portion, and a metal board disposed on the insulating portion and in contact with the wiring portion. The metal board is provided with a plurality of electrical contacts and a heat dissipating portion. The metal board can maintain a predefined heat dissipation area via the heat dissipating portion, and be connected to a circuit board via the electrical contacts.

10 Claims, 4 Drawing Sheets

(56) References Cited

U.S. PATENT DOCUMENTS

| | | | | |
|---|---|---|---|---|
| 6,333,857 | B1* | 12/2001 | Kanbe | H01L 23/49822 |
| | | | | 174/262 |
| 6,451,627 | B1* | 9/2002 | Coffman | H01L 21/4832 |
| | | | | 257/E23.054 |
| 6,495,914 | B1* | 12/2002 | Sekine | H01L 23/5389 |
| | | | | 257/706 |
| 6,548,328 | B1* | 4/2003 | Sakamoto | H01L 21/4821 |
| | | | | 257/666 |
| 7,042,083 | B2* | 5/2006 | Sugizaki | H01L 23/49816 |
| | | | | 257/701 |
| 8,779,572 | B2* | 7/2014 | Lin | H01L 21/76898 |
| | | | | 257/635 |
| 2002/0180027 | A1* | 12/2002 | Yamaguchi | H01L 21/486 |
| | | | | 257/700 |
| 2003/0141105 | A1* | 7/2003 | Sugaya | H01L 21/56 |
| | | | | 174/256 |
| 2006/0249845 | A1* | 11/2006 | Takai | H01L 23/3192 |
| | | | | 257/750 |
| 2007/0102142 | A1* | 5/2007 | Reis | H01L 23/3677 |
| | | | | 165/80.3 |
| 2008/0036061 | A1* | 2/2008 | Chainer | H01L 21/486 |
| | | | | 257/686 |
| 2009/0121337 | A1* | 5/2009 | Abe | H01L 21/67092 |
| | | | | 257/686 |

* cited by examiner

ELECTRONIC PACKAGE AND ITS PACKAGE SUBSTRATE

BACKGROUND

1. Technical Field

The present disclosure relates to electronic packages and their package substrates, and, more particularly, to an electronic package having a metal board in direct with an insulation portion and a wiring portion and its package substrate.

2. Description of Related Art

Many electronic products nowadays are equipped with sensing systems, such as optical module products and sensor module products, which are especially suited for high heat dissipation, high flatness and high rigidity requirements.

Due to continuous improvement in resolution that results in finer lines and increased cooling requirements, coupled with the need for linkage between lenses in double-camera/three-camera products, state-of-art optical module products often require very flat and rigid substrate as a support. For example, with the development of automatic driving technology, automotive sensors not only demand high accuracy, but also require long-duration continuous actions under high temperature. The requirements on heat dissipation, rigidity and reliability of the module substrates have also increased. A new substrate is required to meet the needs in current technical development.

As shown in FIG. 1, a conventional semiconductor package 1 for a sensor includes at least one sensing chip 11 on a package substrate 10. The sensing area 11a of the sensing chip 11 faces upwards. An encapsulant 12 encapsulates the sensing chip 11. As the top of the sensing area 11a needs to be left unobstructed in order to sense light, a heat sink 13 is bonded underneath the package substrate 10 via a conductive gel 130 in order to dissipate heat generated by the sensing chip 11 via the package substrate 10, the conductive gel 130 and the heat sink 13.

However, in the conventional semiconductor package 1, as the heat sink 13 is bonded as a whole below the package substrate 10, a single heat sink 13 can only be used as a single contact (for connecting to the ground). As a result, the package substrate 10 requires additional layout area (e.g., by increasing its width) to accommodate electrical contacts 100 for connection with a circuit board 9. This increases the overall width of the package substrate 10, which makes it difficult to meet the requirement of a compact semiconductor package.

In addition, if the layout area of the package substrate 10' is not increased, as shown in FIG. 1', the width of the heat sink 13' can be reduced in order to leave the space on the bottom surface of the package substrate 10' for providing the electrical contacts 100 for connecting with the circuit board 9. However, this approach reduces the heat dissipation of the heat sink 13' as the size of the heat sink 13' is reduced, resulting in potential damage of the sensing chip 11 or the package substrate 10' due to overheating.

Moreover, when the conductive gel 130 is used for adhering the heat sink 13 and 13' on the package substrate 10 and 10', the thermal conductivity of the conductive gel 130 may be lower than that of the heat sink 13 and 13', resulting in poorer heat dissipation of the heat sink 13 and 13'.

Furthermore, when the conductive gel 130 is used for adhering the heat sink 13 and 13' on the package substrate 10 and 10', the conductive gel 130 may result in low accuracy in positioning and adhering the heat sink 13 and 13', or even reliability issues such as shortage or overflow of the conductive gel 130.

Therefore, there is a need for a solution that addresses the aforementioned issues in the prior art.

SUMMARY

In view of the aforementioned shortcomings of the prior art, the present disclosure provides a package substrate, which may include: an insulating portion including a first side and a second side opposite to the first side; a wiring portion embedded in the insulating portion; and a metal board disposed on the first side of the insulating portion and in contact with the wiring portion, wherein the metal board is defined with a plurality of electrical contacts and a heat dissipating portion separated from the electrical contacts.

The present disclosure further provides an electronic package, which may include: the package substrate described above; and an electronic component disposed on the second side of the insulating portion and electrically connected with the wiring portion.

In an embodiment, the electronic component may be a sensing chip.

In an embodiment, the electronic package may further include an encapsulation layer encapsulating the electronic component.

In an embodiment, the insulating portion may be made of a dielectric material, such as a molding compound or a primer.

In an embodiment, the metal board may include a steel material or a copper material.

In an embodiment, the electronic package and the package substrate may further include an insulating protective layer disposed on the second side of the insulating portion and exposing the wiring portion.

In conclusion, the electronic package and its package substrate according to the present disclosure define a plurality of electrical contacts and a heat dissipating portion from a metal board. Therefore, a single metal board can be used to maintain a predefined heat dissipating area using the heat dissipating portion, and externally connect to an electronic device of a circuit board via the plurality of electrical contacts. Compared to the prior art, the package substrate according to the present disclosure is able to be externally connected with the electronic device of the circuit board without the need for an additional layout area or the need to reduce the heat dissipating area, thereby maintaining the expected heat dissipation. The present disclosure therefore meets both the requirements for miniaturization and good heat dissipation.

Moreover, the electronic package according to the present disclosure allows heat from the electronic component to be dissipated outside via the metal board by allowing the metal board to be directly in contact with the insulating portion and the wiring portion without going through a conductive gel. Thus, compared with the prior art, without the influence of the conductive gel, the electronic package according to the present disclosure is able to achieve the heat dissipation expected of the heat dissipating portion, and the metal board can be accurately positioned without poor alignment issue.

The reliability issues associated with shortage or overflow of the conductive gel can also be eliminated.

BRIEF DESCRIPTION OF THE DRAWINGS

FIG. 1' is a cross-sectional schematic diagram depicting another conventional semiconductor package;

DETAILED DESCRIPTION OF THE EMBODIMENTS

Figure 1:
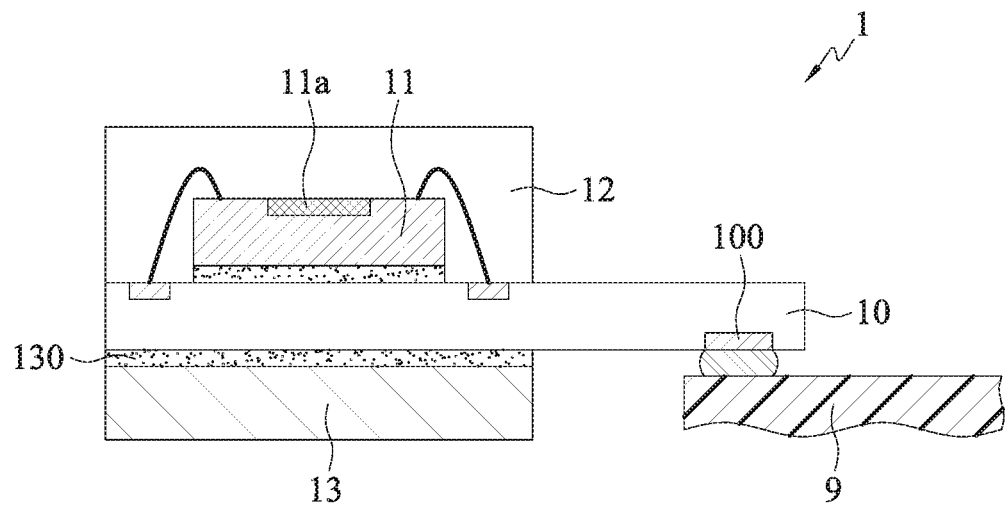
FIG. 1 is a cross-sectional schematic diagram depicting a conventional semiconductor package.
Figure 1:
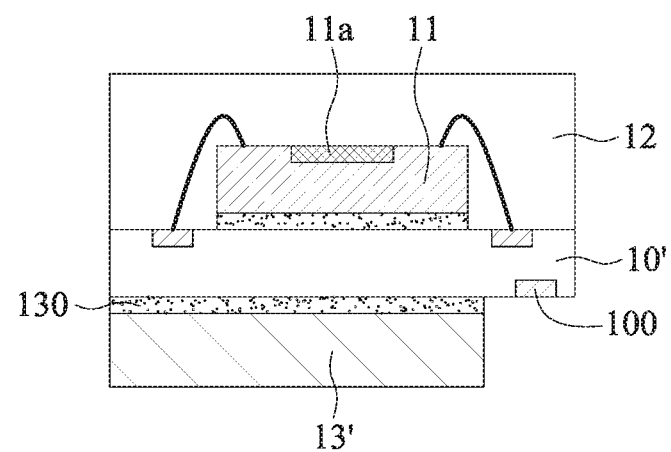

The present disclosure is described by the following specific embodiments. Those with ordinary skills in the arts can readily understand other advantages and functions of the present disclosure after reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "above", "below", "first", "second", "one", "a", "an", and the like, are for illustrative purposes only, and are not meant to limit the range implementable by the present disclosure. Any changes or adjustments made to their relative relationships, without modifying the substantial technical contents, are also to be construed as within the range implementable by the present disclosure.

FIGS. 2A to 2E are cross-sectional schematic diagrams depicting a method for manufacturing an electronic package 2 in accordance with the present disclosure.

Figure 2A:
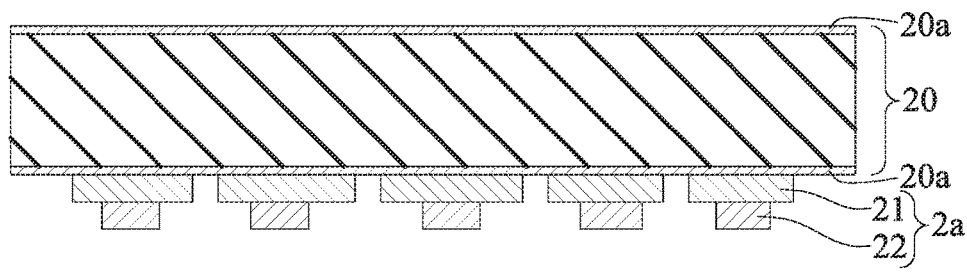
FIGS. 2A to 2E are cross-sectional schematic diagrams depicting a method for manufacturing an electronic package in accordance with the present disclosure, wherein FIG. 2D' is a bottom view of FIG. 2D.

As shown in FIG. 2A, during a patterned manufacturing process a first wiring portion 2a is formed on a metal base 20, wherein a first patterned process is performed to form a first wiring layer 21, and then a second patterned process is performed to form a plurality of first conductive posts 22 on the first wiring layer 21, such that the first wiring portion 2a includes the first wiring layer 21 and the first conductive posts 22 stacked thereon.

In an embodiment, the metal base 20 is a steel base with metal layers 20a (e.g., copper layers) on both sides thereof. However, the structure of the metal base 20 is not limited to the above.

Moreover, the first conductive posts 22 are in contact and electrically connected with the first wiring layer 21.

Figure 2B:
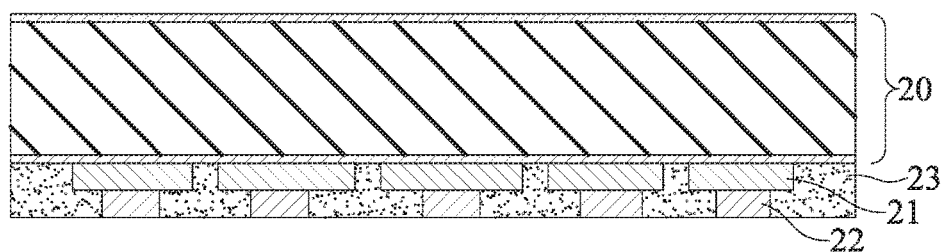

As shown in FIG. 2B, a first insulating layer 23 is formed on the metal base 20, and the first conductive posts 22 are exposed from the first insulating layer 23, wherein the surfaces of the first conductive posts 22 are flush with the surface of the first insulating layer 23.

In an embodiment, the first insulating layer 23 is formed on the metal base 20 by casting, coating or lamination. The first insulating layer 23 may be made of a dielectric material, such as epoxy resin. The epoxy resin may further include a molding compound or a primer, such as an epoxy molding compound (EMC). The epoxy molding compound may contain fillers. The content of the filler is between 70 to 90 wt %.

Figure 2C:
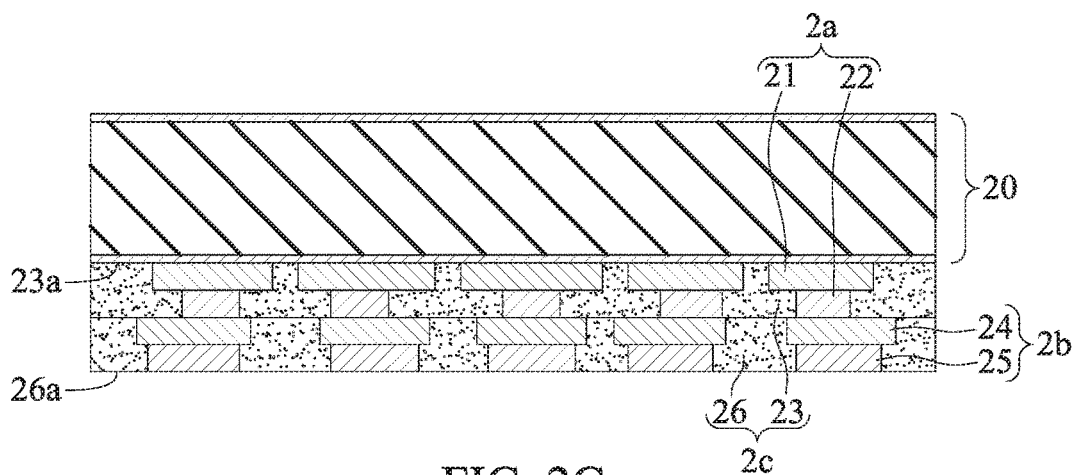

As shown in FIG. 2C, a build-up structure is formed as needed on the first insulating layer 23 and the first conductive posts 22.

In an embodiment, the build-up structure includes a second wiring portion 2b and a second insulating layer 26, wherein the second wiring portion 2b includes a second wiring layer 24 and a plurality of second conductive posts 25 stacked thereon, and the second wiring layer 24 are in contact and electrically connected with the second conductive posts 25 and the first conductive posts 22.

Moreover, the second insulating layer 26 is formed on the first insulating layer 23 to encapsulate the second wiring portion 2b. The first insulating layer 23 and the second insulating layer 26 together form an insulating portion 2c. In an embodiment, a surface of the first insulating layer 23 acts as a first side 23a of the insulating portion 2c, and a surface of the second insulating layer 26 acts as a second side 26a of the insulating portion 2c.

Furthermore, the second insulating layer 26 is formed by casting, coating or lamination, for example. The second insulating layer 26 may be made of a dielectric material, such as epoxy resin. The epoxy resin may further include a molding compound or a primer, such as an epoxy molding compound (EMC). The epoxy molding compound may contain fillers. The content of the filler is between 70 to 90 wt %.

In addition, the second insulating layer 26 and first insulating layer 23 may be made of the same or different materials.

Figure 2D:
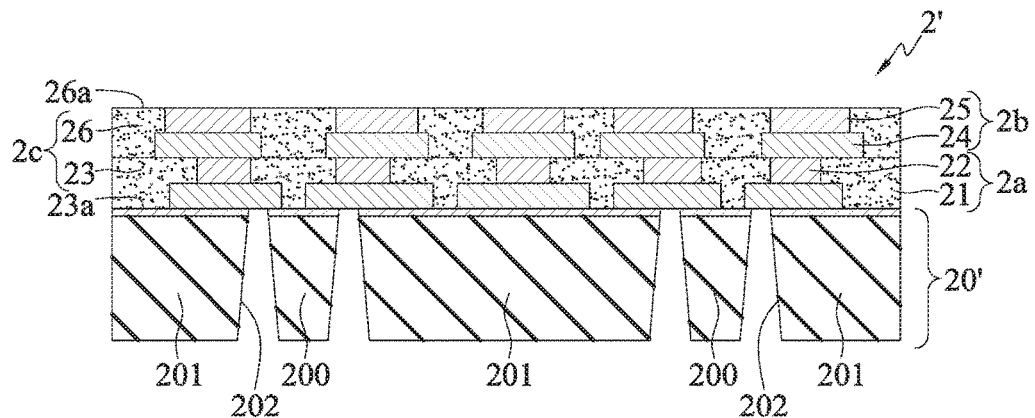
Figure 2D:
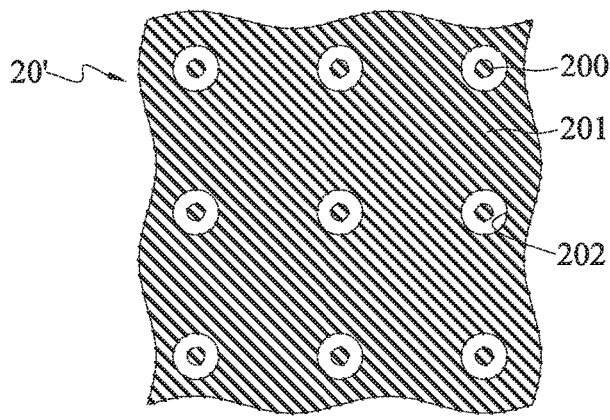

As shown in FIG. 2D, a portion of the metal base 20 is removed by a patterned manufacturing process to form a metal board 20' containing a plurality of electrical contacts 200 and a heat dissipating portion 201, thereby forming a package substrate 2'. The electrical contacts 200 and the heat dissipating portion 201 are separated from each other, wherein the electrical contacts 200 are electrically connected with the first wiring layer 21, while the heat dissipation portion 201 is thermally connected with the first wiring layer 21.

In an embodiment, as shown in FIG. 2D', annular openings 202 are formed on the metal base 20. Conductive posts inside the openings 202 are defined as the electrical contacts 200, and the rest of the metal material are the heat dissipating portion 201.

In an embodiment, the metal board 20' of the package substrate 2' provides better conductivity to the electrical contacts 200 and better thermal conductivity to the heat dissipating portion 201 through the copper (compared to steel) metal layer 20a.

Figure 2E:
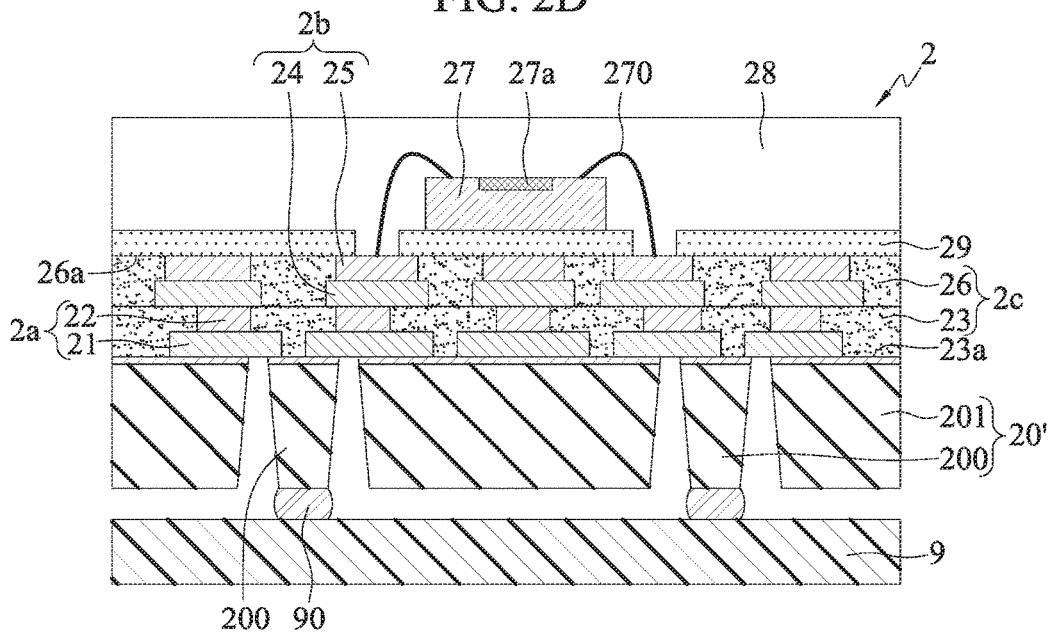

As shown in FIG. 2E, at least one electronic component 27 is disposed on the package substrate 2'. The electronic component 27 is electrically connected with the second conductive posts 25. An encapsulation layer 28 is further formed on the package substrate 2' to encapsulate the electronic component 27.

In an embodiment, before the electronic component 27 is provided, an insulating protective layer 29 can be formed on the second insulating layer 26 and the second conductive posts 25, wherein the second conductive posts 25 are exposed from the insulating protective layer 29.

In an embodiment, the electronic component 27 is an active element, a passive element or a combination of both. The active element may be, for example, a semiconductor chip, and the passive element may be, for example, a resistor, a capacitor or an inductor. In an embodiment, the electronic component 27 is a sensing chip having a sensing area 27a for detecting light, variations in charges, or temperature changes etc., such that the electronic component 27 can recognize the signals received by the sensing area 27a. In an embodiment, the electronic component 27 can be electrically connected with the package substrate 2' through a plurality of conductive bumps (e.g., solder materials) (not shown) in a flip-chip manner. Alternatively, the electronic component 27 can be electrically connected with the package substrate 2' through a plurality of conductive wires by wire bonding. However, the electrical connection between the electronic component and the package substrate is not limited as such.

Moreover, in subsequent manufacturing processes, the electronic package 2 can be connected to an electronic device on a circuit board via soldering materials 90 and the electrical contacts 200 of the metal board 20'.

Therefore, the electronic package 2 according to the present disclosure defines a plurality of electrical contacts 200 and a heat dissipating portion 201 from the metal board 20' of the package substrate 2', such that a single metal board 20' can be used to maintain a predefined heat dissipating area using the heat dissipating portion 201, and be connected externally to the electronic device of the circuit board 9 via the plurality of electrical contacts 200. Thus, compared to the prior art, the package substrate 2' according to the present disclosure is able to be externally connected with the electronic device of the circuit board 9 without the need for additional layout area (e.g., no increased width) or the need to reduce the heat dissipating area, thereby maintaining the expected heat dissipation. The present disclosure therefore meets both the requirements for miniaturization and good heat dissipation.

Moreover, the electronic package 2 according to the present disclosure allows heat generated by the electronic component 27 to be dissipated outside via the metal board 20' by allowing the metal board 20' to be directly in contact with the insulating portion 2c and the first wiring portion 2a without going through a conductive gel. Thus, compared to the prior art, without the influence of the conductive gel, the electronic package 2 according to the present disclosure is able to achieve the heat dissipation expected of the heat dissipating portion 201, and the metal board 20' can be accurately positioned without poor alignment issue. The reliability issues associated with shortage or overflow of the conductive gel are also eliminated.

In addition, the manufacturing process of the package substrate according to the present disclosure is not limited to the above. An exposure development and plating method as shown in FIGS. 3A to 3C can also be applied and details of which are set forth below.

Figure 3A:
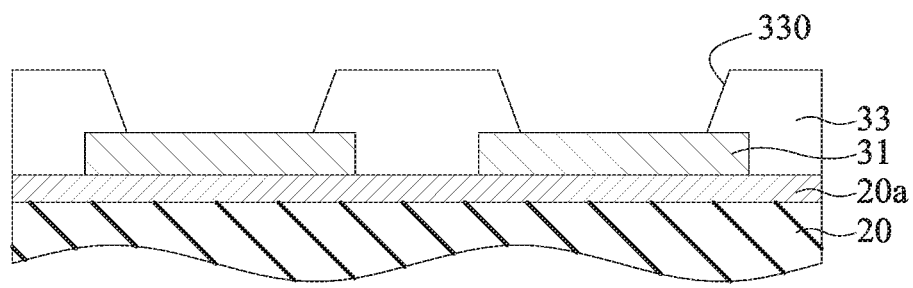
FIGS. 3A to 3C are cross-sectional schematic diagrams depicting another embodiment of the manufacturing process of FIGS. 2A to 2C.

As shown in FIG. 3A, a first wiring layer 31 and an insulating layer 33 are sequentially formed on the metal base 20. A plurality of blind vias 330 are formed in the insulating layer 33, such that portions of the surface of the control unit 31 are exposed from the blind vias 330.

Figure 3B:
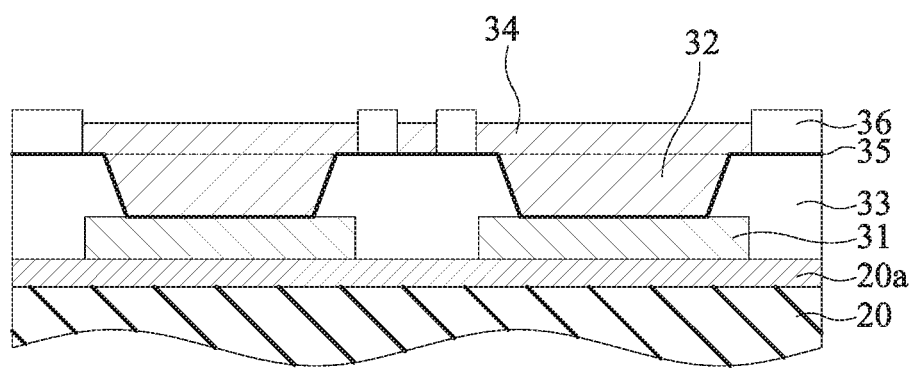
Figure 3C:
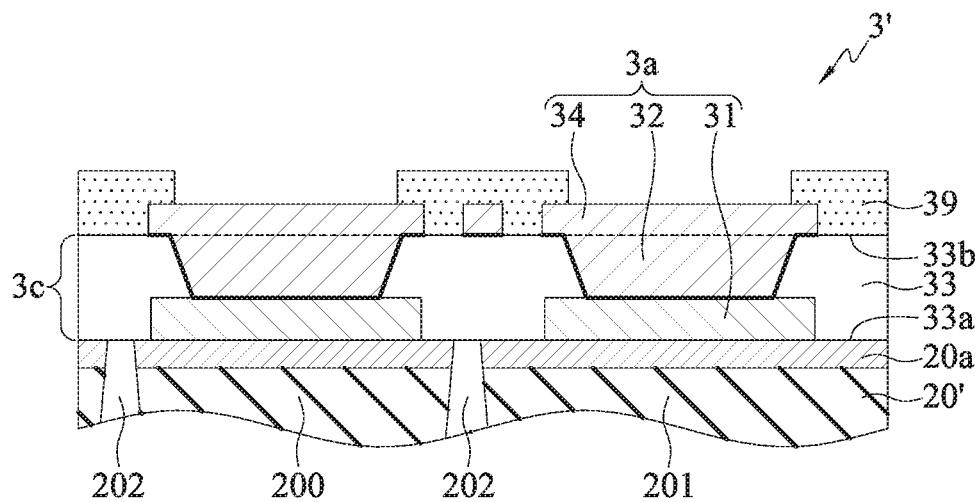

As shown in FIG. 3B, an electrically conductive layer 35 is formed on the insulating layer 33 and in the blind vias 330. A resist layer 36 is further formed on the electrically conductive layer 35. The resist layer 36 includes a plurality of opening regions formed by exposure development, such that portions of the electrically conductive layer 35 and the blind vias 330 are exposed from these opening regions.

Then, a second wiring layer 34 and conductive posts 32 (the two are delimited by dotted lines) are electroplated in the opening regions, wherein the conductive posts 32 are formed in the blind vias 330 to electrically connect the first wiring layer 31 with the second wiring layer 34.

As shown in FIG. 3C, the resist layer 36 and the underlying electrically conductive layer 35 are removed. The metal base 20 is processed to define the electrical contacts 200 and the heat dissipating portion 201.

In an embodiment, the first wiring layer 31, the second wiring layer 34 and the conductive posts 32 act as a wiring portion 3a of a package substrate 3', and the insulating layer 33 acts as an insulating portion 3c of the package substrate 3'. The insulating portion 3c includes a first side 33a and a second side 33b opposite to the first side 33a, and the electrical contacts 200 and the heat dissipating portion 201 are disposed on the first side 33a of the insulating portion 3c.

Moreover, the number of layers in the wiring portion 3a can be designed as needed, and it is not limited to the number of layers described above.

Furthermore, an insulating protective layer 39 can be further formed on the second side 33b of the insulating portion 3c as a solder resist layer. The wiring portion 3a (e.g., the second wiring layer 34) is exposed from the insulating protective layer 39 so as to be electrically connected with the electronic component 27 in the subsequent packaging process.

The present disclosure provides an electronic package 2, which includes: a package substrate 2', 3', and at least one electronic component 27, wherein the package substrate 2', 3' includes: an insulating portion 2c, 3c, a wiring portion 3a (or first and second wiring portions 2a, 2b), and a metal board 20'.

The insulating portion 2c, 3c includes a first side 23a, 33a and a second side 26a, 33b opposite to the first side 23a, 33a.

The wiring portion 3a (or the first and second wiring portions 2a, 2b) is disposed in the insulating portion 2c, 3c.

The metal board 20' is disposed on the first side 23a, 33a of the insulating portion 2c, 3c and in contact with the wiring portion 3a (or the first wiring portion 2a), wherein the metal board 20' is defined with a plurality of electrical contacts 200 and a heat dissipating portion 201 separated from each other.

The electronic component 27 is disposed on the second side 26a, 33b of the insulating portion 2c, 3c and electrically connected with the wiring portion 3a (or the second wiring portion 2b).

In an embodiment, the insulating portion 2c, 3c is made of a dielectric material, such as a molding compound or a primer, which contains fillers, wherein the content of the filler is between 70 to 90 wt %.

In an embodiment, the metal board 20' includes a steel or copper material (e.g., the metal layer 20a).

In an embodiment, the package substrate 2', 3' further includes an insulating protective layer 29, 39 disposed on the second side 26a, 33b of the insulating portion 2c, 3c and exposes the wiring portion 3a (or the second wiring portion 2b).

In an embodiment, the electronic component 27 is a sensing chip.

In an embodiment, the electronic package 2 further includes an encapsulation layer 28 for encapsulating the electronic component 27.

In conclusion, the electronic package and its package substrate according to the present disclosure define a plurality of electrical contacts and a heat dissipating portion from a metal board. Therefore, a single metal board can be used to maintain a predefined heat dissipating area using the heat dissipating portion, and be externally connected to an electronic device of a circuit board via the plurality of electrical contacts. Thus, the package substrate according to the present disclosure is able to be externally connected with the electronic device of the circuit board without the need for additional layout area or the need to reduce the heat dissipating area, thereby maintaining the expected heat dissipation. The present disclosure therefore meets both the requirements for miniaturization and good heat dissipation.

Moreover, the electronic package according to the present disclosure allows heat generated by the electronic component to be dissipated outside via the metal board by allowing the metal board to be directly in contact with the insulating portion and the wiring portion without going through a conductive gel. Thus, without the influence of the conductive gel, the electronic package according to the present disclosure is able to achieve the heat dissipation expected of the heat dissipating portion, and the metal board can be accurately positioned without poor alignment issue. The reliability issues associated with shortage or overflow of the conductive gel can also be eliminated.

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims.

What is claimed is:

1. A package substrate, comprising:
   an insulating portion including a first side and a second side opposite to the first side;
   a wiring portion embedded in the insulating portion; and
   a metal board disposed on the first side of the insulating portion and in contact with the wiring portion,
   wherein the metal board is defined with a plurality of electrical contacts and a heat dissipating portion separated from the plurality of electrical contacts,
   wherein the metal board includes a plurality of openings, with parts of the metal board at an interior of the plurality of openings forming conductive posts being defined as the plurality of electrical contacts and a remaining part of the metal board at a periphery of the plurality of openings being defined as the heat dissipating portion separated from the plurality of electrical contacts by the plurality of openings.

2. The package substrate of claim 1, wherein the insulating portion is made of a molding compound or a primer.

3. The package substrate of claim 1, wherein the metal board includes a steel material or a copper material.

4. The package substrate of claim 1, further comprising an insulating protective layer disposed on the second side of the insulating portion, with the wiring portion partially exposed from the insulating protective layer.

5. An electronic package, comprising:
   the package substrate of claim 1; and
   an electronic component disposed on the second side of the insulating portion and electrically connected with the wiring portion.

6. The electronic package of claim 5, wherein the insulating portion is made of a molding compound or a primer.

7. The electronic package of claim 5, wherein the metal board includes a steel material or a copper material.

8. The electronic package of claim 5, further comprising an insulating protective layer disposed on the second side of the insulating portion, with the wiring portion partially exposed from the insulating protective layer and electrically connected to the electronic component.

9. The electronic package of claim 5, wherein the electronic component is a sensing chip.

10. The electronic package of claim 5, further comprising an encapsulation layer encapsulating the electronic component.

* * * * *